United States Patent [19]
Lee et al.

[11] Patent Number: 6,093,599
[45] Date of Patent: Jul. 25, 2000

[54] METHOD OF MANUFACTURING INDUCTOR DEVICE ON A SILICON SUBSTRATE THEREOF

[75] Inventors: Jin Hyo Lee; Heung Soo Rhee; Hyun Kyu Yu; Bo Woo Kim; Kee Soo Nam, all of Daejon, Rep. of Korea

[73] Assignee: Electronics and Telecomunications Research Institute, Daejon, Rep. of Korea

[21] Appl. No.: 09/232,691

[22] Filed: Jan. 19, 1999

Related U.S. Application Data

[62] Division of application No. 09/146,528, Sep. 3, 1998, abandoned.

[30] Foreign Application Priority Data

Dec. 27, 1997 [KR] Rep. of Korea ............... 97 75366

[51] Int. Cl.$^7$ ............................................ H01L 21/8234
[52] U.S. Cl. ............................................ 438/238; 438/381
[58] Field of Search ............................ 438/238, 381, 438/622–625

[56] References Cited

U.S. PATENT DOCUMENTS

| | | |
|---|---|---|
| 5,227,659 | 7/1993 | Hubbard . |
| 5,336,921 | 8/1994 | Sundaram et al. . |
| 5,446,311 | 8/1995 | Ewen et al. . |
| 5,541,442 | 7/1996 | Keil et al. . |
| 5,656,849 | 8/1997 | Burghartz et al. . |
| 5,663,570 | 9/1997 | Reedy et al. . |
| 5,773,353 | 6/1998 | Kwon et al. ..................... 438/426 |
| 5,872,043 | 6/1998 | Chen ............................... 438/424 |

OTHER PUBLICATIONS

Marc E. Goldfarb et al., "The Effect of Air Bridge Height on the Propagation Characteristics of Microstrip", IEEE Microwave and Guided Wave Letters, vol. 1, No. 10, Oct. 1991, pp. 18–19.

Ronald G. Arnold et al., "Microwave Characterization of Microstrip Lines and Spiral Inductors in MCM–D Technology", 1992 IEEE.

Joachim N. Burghartz et al., "High–Q Inductors in Standard Silicon Interconnect Technology and its Application to an Integrated RF Power Amplifier", IEDM 95, 29.8.1–29.8.3, pp. 1015–1017.

*Primary Examiner*—Jey Tsai
*Attorney, Agent, or Firm*—Jacobson, Price, Holman & Stern, PLLC

[57] ABSTRACT

The present invention relates to a on silicon substrate, specifically to an inductor device and manufacturing method thereof for enhancing the quality factor of the inductor by disposing trenches on a silicon substratre, and by filling the inside of the trenches with polycrystalline polysilicon not doped with impurities. The present invention provides an inductor device and a manufacturing method thereof which can improve the quality factor by increasing resistance of the substrate by forming deep trenches disposed in specific patterns on a low-resistance silicon substrate and filling polycrystalline silicon not doped with impurities, and by reducing parasitic capacitance between the inductor and the silicon substrate.

15 Claims, 9 Drawing Sheets

METHOD OF MANUFACTURING INDUCTOR DEVICE ON A SILICON SUBSTRATE THEREOF

This is a divisional application of application Ser. No. 09/146.528 filed Sep. 3. 1998 abandoned.

BACKGROUND OF THE INVENTION

1. Field of the Invention

The present invention relates to inductor on a silicon substrate, specifically to an inductor device and manufacturing method thereof for enhancing the quality factor of the inductor by disposing trenches on a silicon substrate, and by filling the inside of the trenches with polycrystalline polysilicon not doped with impurities.

2. Description of the Related Art

In the design of monolithic microwave integrated circuits (MMIC), inductor are generally required for impedance matching. The characteristics of an inductor are determined not only by its inductance but also by its quality factor. Recently, it has been made possible to integrate inductor on a substrate. The so-called integrated inductor made it possible to manufacture a silicon MMIC in which both transistors which is active devices and inductor which is passive devices are integrated on the same chip. One of the most difficult problems in implementing these integrated inductor is that the characteristics of the inductor is largely dependant on the resistivity of the silicon substrate on which the inductor resides.

Here, the prior art inductor devices on the silicon substrate and manufacturing method thereof will be described referring to FIGS. 1 and 3.

Figure 1A:
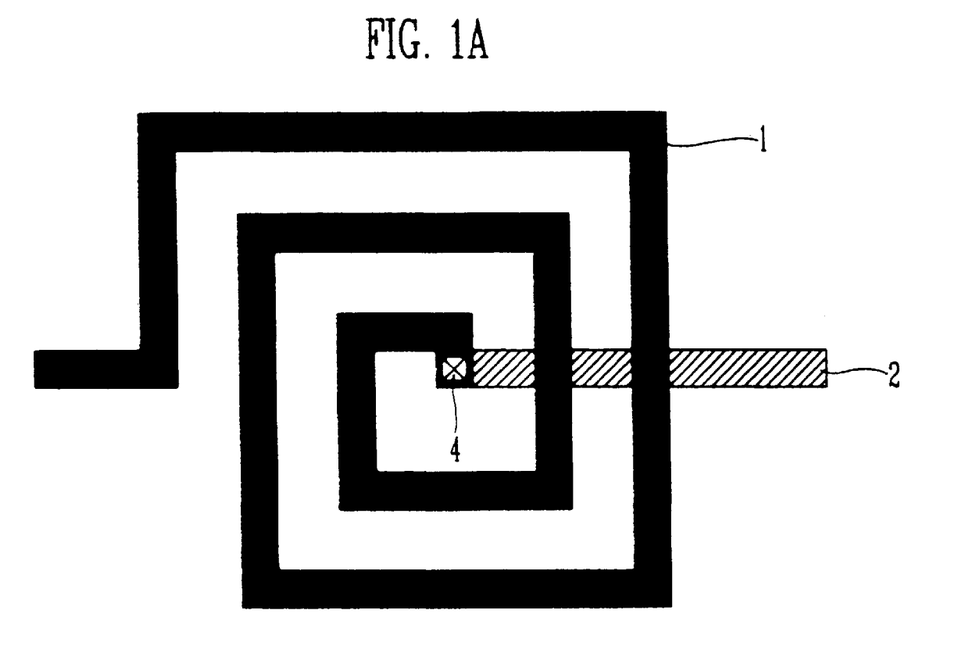
FIG. 1a is a top view of the prior art inductor device using a silicon substrate.
Figure 1B:
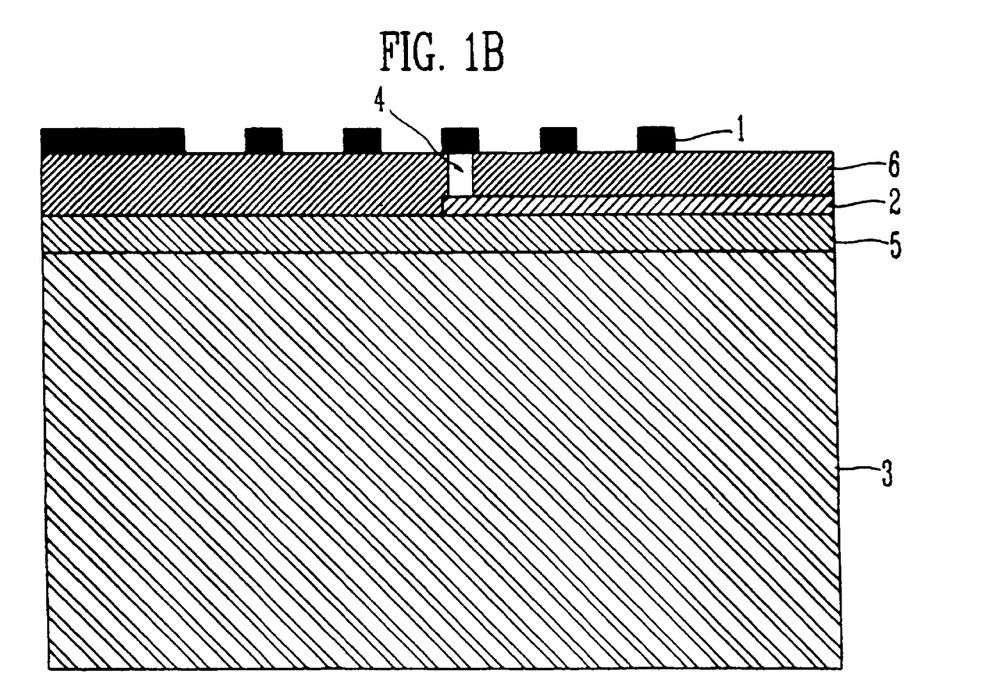
FIG. 1b is a sectional view of the prior art inductor device using a silicon substrate.

FIGS. 1a and 1b are a top view and a sectional view of the prior art inductor device for manufacturing MMIC on a silicon substrate respectively.

To manufacture the above mentioned inductor device, first insulating layer 5 is formed on a silicon substrate 3. Then, first metal line 2 of the inductor is formed on the first insulating layer 5. Second insulating layer 6 is formed on the first metal line 2 and the first metal line 2 is connected to second metal line 1 through via 4 in the second insulating layer 6. The quality factor of the inductor is largely affected by capacitance between the metal line of the inductor and the silicon substrate and by the resistance of the silicon substrate.

Figure 3:
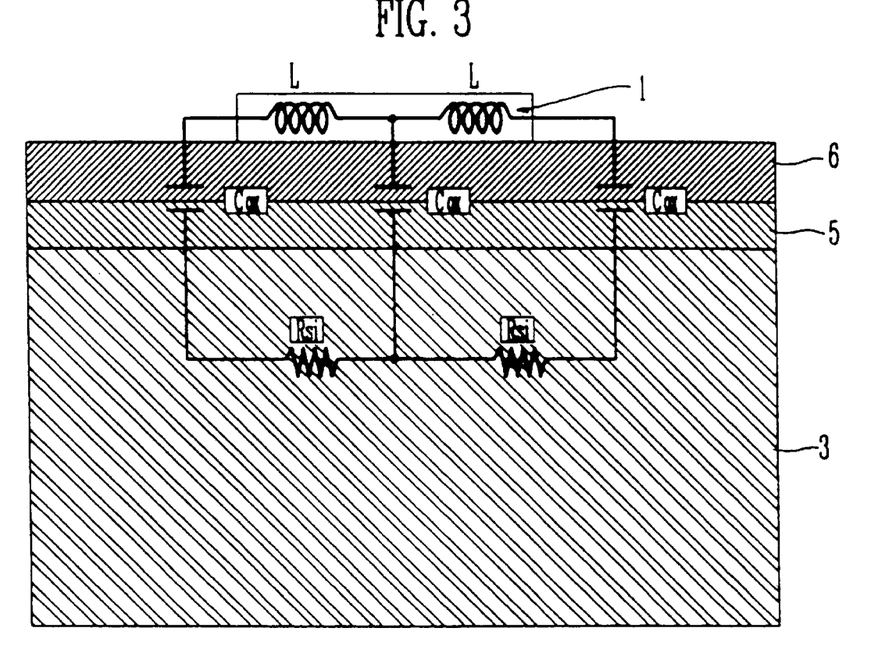
FIG. 3 is an equivalent circuit of the prior art inductor using a silicon substrate.

FIG. 3 is an equivalent circuit of the prior art inductor in which the capacitance by the insulation layers 6 and 5, which are between the second metal line 1 of the inductor and the silicon substrate 3 is denoted by Cox, and the resistance of the silicon substrate 3 is denoted by Rsi. For the quality factor of the inductor to be large, Cox should be small and Rsi should be as large as possible. Thus, insulating layers has been made thick or silicon substrates with high resistivity has been used so far. If the thickness of the insulating layer reaches several to 10 micrometers, however, it is hard to integrate active devices on the same chip. Also, if the silicon substrate with high resistivity is used, it is hard to integrate active devices with the standard processes on the same chip and the process cost will be increased.

SUMMARY OF THE INVENTION

It is an object of the present invention to provide the inductor device and the a manufacturing method which is the filling of polycrystalline silicon into a trench on the substrate under the inductor and, to integrate active devices such as bipolar transistors, MOS transistors and passive devices such as inductor at the same time to enhance the characteristics of silicon MMIC and to reduce manufacturing cost.

Also, it is an object of the present invention to provide a manufacturing method for the bonding pads and high frequency signal lines in the integrated circuits. The inductor device to achieve the above-mentioned purposes comprises two or more trenches disposed on the silicon substrate located on the lower portions of inductor metal lines; an insulating layer surrounding said trenches; a polycrystalline silicon area not doped with impurities filled into said trenches surrounded by said insulating layer; an insulating layer deposited on the upper part of said polycrystalline silicon and surface of the substrate; first metal line of the inductor formed on selected portions of the upper part of said insulating layer; an insulating layer deposited on said first metal line and surface of the substrate; via holes through the selected portions of said insulating layer and formed on selected portions on the first metal line; and second metal line connected to said first metal line by filling with the second method said via holes.

The manufacturing method of the inductor according to the present invention comprises steps of forming first insulating layer on the silicon substrate, and then forming trench substrate having two or more trenches by etching selected areas in said silicon substrate using a mask, and then removing the first insulating layer so that said trench substrate is exposed; forming second insulating layer by applying oxidation process on said trench substrate; depositing undoped polycrystalline silicon on the entire structure of said trench substrate, and then polishing said polycrystalline silicon to the surface of said second insulating layer by the chemical and mechanical polishing method; depositing third insulating layer and a metal layer successively on the trench substrate where said polycrystalline silicon is filled, and then forming first metal line by an etching process using a mask; and depositing fourth insulating layer on said first metal line, forming via holes by an etching process using a mask on selected areas of said fourth insulating layer, depositing metal layer, and then forming second metal line by an etching process using a mask.

BRIEF DESCRIPTION OF THE DRAWINGS

The objects, features and advantages of the present invention will be apparent to one skilled in the art from the following detailed description in conjunction with the accompanying drawings, in which.

DETAILED DESCRIPTION OF THE PREFERRED EMBODIMENT

Now, detailed description of the present invention follows referring to the attached figures.

Figure 2A:
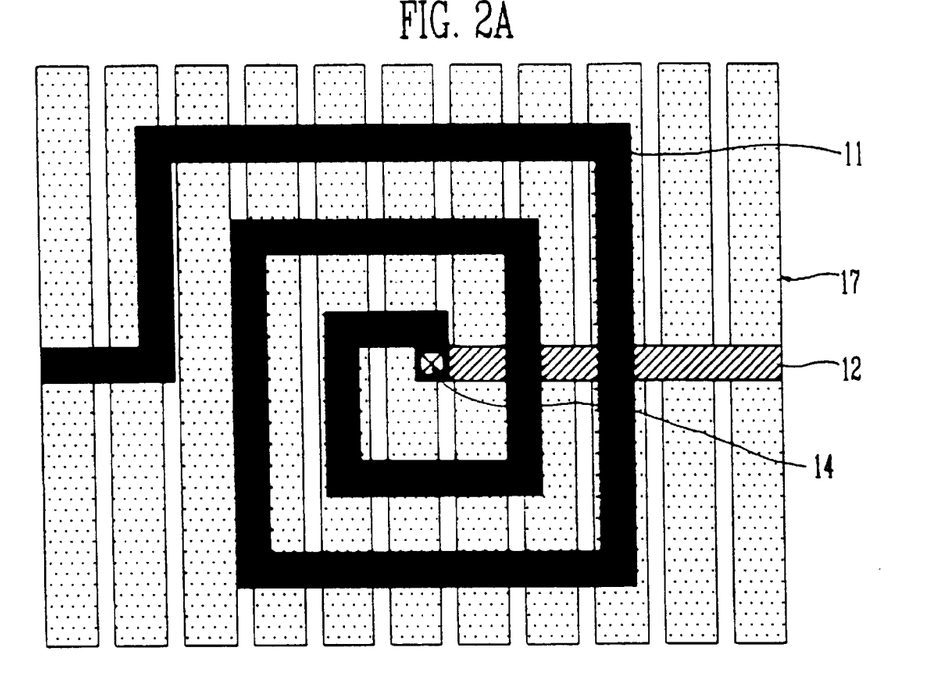
FIG. 2a is a top view of the inductor on a silicon substrate according to the present invention.
Figure 2B:
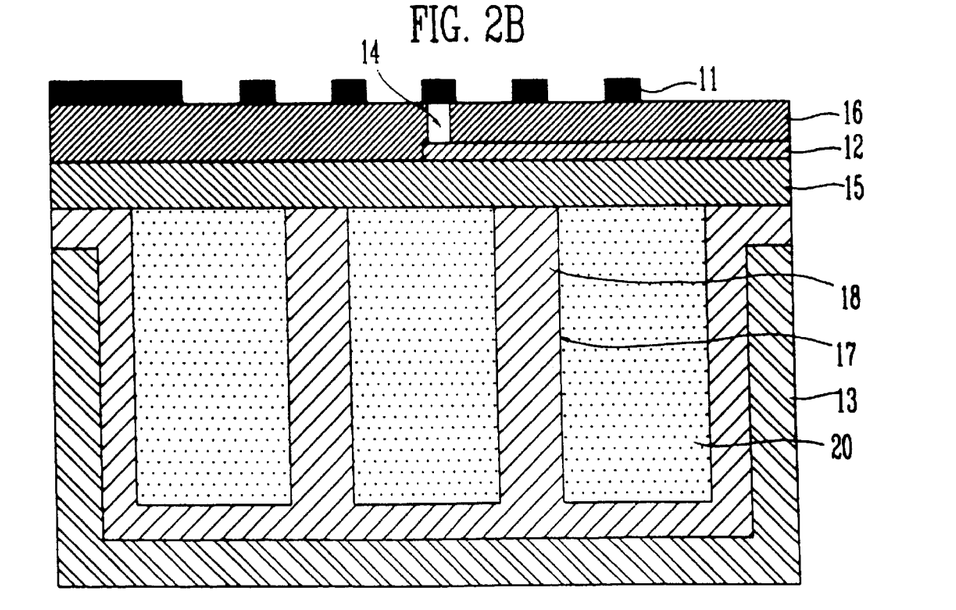
FIG. 2b is a sectional view of the inductor on a silicon substrate according to the present invention.

FIGS. 2a and 2b are respectively a top view and a sectional view of the inductor according to the present invention.

The inductor is composed of second insulating layer 18 formed by completely oxidized walls between trench 17 and trench 17 disposed inside a silicon substrate 13, polycrystalline silicon 20 not doped with impurities filled into the trenches 17, third insulating layer 15 formed on the overall structure, first metal line 12 of the inductor formed on selected area of the third insulating layer 15, fourth insulating layer 16 formed on selected area of the overall structure, via holes 14 formed on selected area on the first metal line 12, and second metal line 11 formed on selected area of the via holes 14, the second metal line 11 of the inductor being connected through the via holes 14.

Particularly, the distance between trench 17 and trench 17 is made narrow in FIG. 2b to make it easy for the silicon between them to be oxidized. The depth of the trenches is made deep, while making the width narrow thereby making it possible to fill the depth of all the trenches only by depositing the polycrystalline silicon having about a half of the width of the trenches. This facilitates the manufacturing process. Also, trenches in FIG. 2a located under the inductor metal lines have a longer length than the width, and the length of the trenches are longer than the size of the entire inductor.

Figure 4:
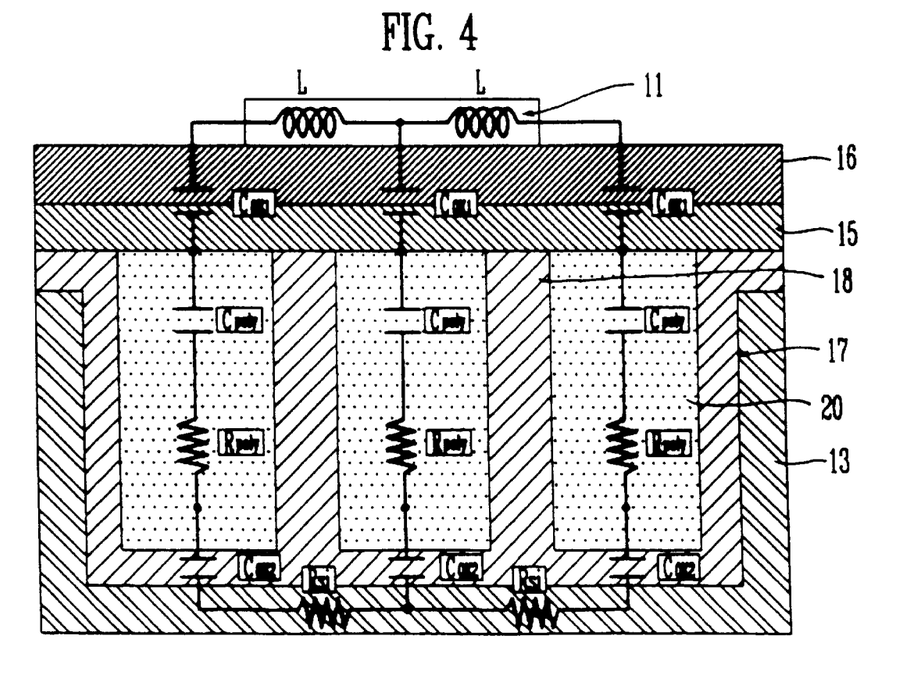
FIG. 4 is an equivalent circuit of the present invention inductor using a silicon substrate.

FIG. 4 illustrates the equivalent circuit of the inductor device according to the present invention.

Let the capacitance by the insulating layers 16 and 15 between the second metal line 11 of the inductor and the polycrystalline silicon 20 be denoted by Cox1, and let the capacitance by the insulating layer 18 between the polycrystalline silicon 20 and silicon substrate 13 be denoted by Cox2. Cpoly denotes the capacitance by the depletion layer of electrons and holes inside the polycrystalline silicon, Rpoly denotes the resistance of the polycrystalline silicon, and Rsi denotes the resistance of the silicon substrate. In the illustrated FIG. 4, as polycrystalline silicon 20 is filled into trenches with several to several tens micrometers of depth not doped with impurities, Cpoly is small while Rpoly is large. Further, the silicon between the trench 17 and the trench 17 is completely oxidized to improve the quality factor of the inductor.

As shown, the present invention make it possible to integrate inductor with a high quality factor into the same chip while using substrates with low resistance which enables the manufacturing of standard active devices such as bipolar transistors and MOS transistors. Thus, the present invention is suitable for implementing the cost-effective silicon MMIC with good high-frequency characteristics.

The above-mentioned inductor on the silicon substrate is composed of a substrate with trenches being formed on the silicon substrate(hereinafter "trench substrate"), an area filled with polycrystalline silicon inside the trenches of the trench substrate, and an inductor metal line area composed of a insulating layer and a metal line over the polycrystalline silicon filled inside the trenches of the trench substrate.

FIGS. 5a to 5e are sectional views illustrating first embodiment of the manufacturing method of the inductor according to the present invention.

Figure 5A:
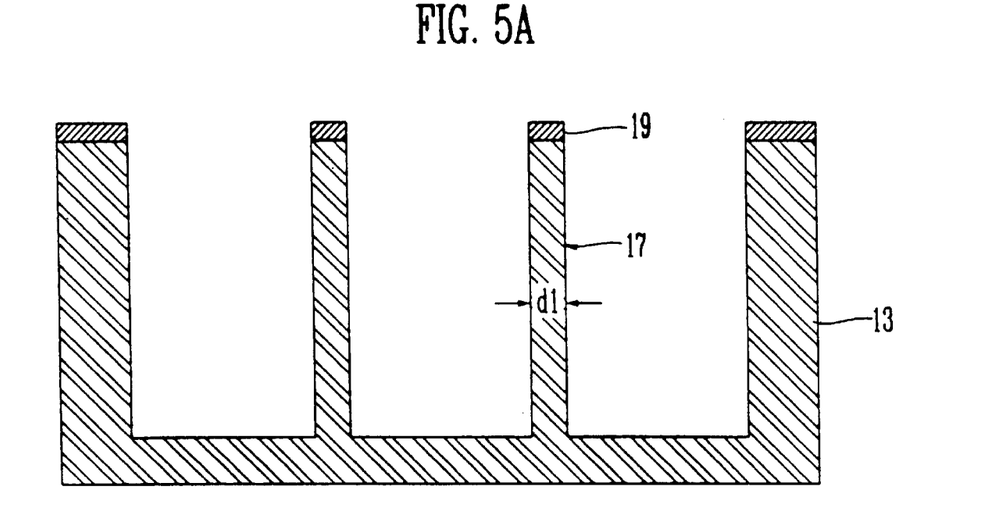
FIGS. 5a to 5e are sectional views illustrating first embodiment of the manufacturing method of the inductor according to the present invention.

FIG. 5a illustrates the process of manufacturing the trench substrate, where FIG. 5a shows the sectional view of the trench substrate after the processes of forming first insulating layer 19 on the silicon substrate 13, and etching the first insulating layer 19 and the silicon substrate 13 by several to several tens of micrometers to form trenches 17, thereby exposing the trench substrate 13. Here, the trenches 17 are formed in such an arrangement that the distance between the trenches are narrower than the length of the trenches, and that the depth of the trenches are larger than the width of the trenches. Also, the length of the trenches may be larger than the planar length of the inductor disposed above the trenches composed of the first and second metal lines.

Figure 5B:
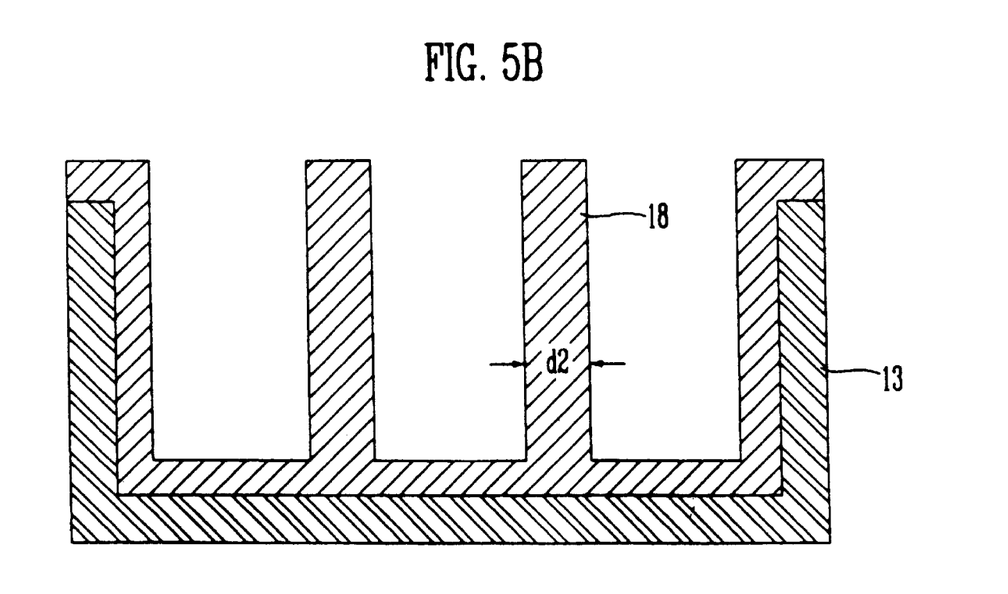

FIG. 5b shows the sectional view of the trench substrate after the process of forming second insulating layer 18 oxidized to depth d2 of about 0.5 to 2 micrometers by oxidizing all walls between the trenches 17 shown in FIG. 5a. Because the silicon is oxidized in both sides of the trench wall, it is possible to accomplish the oxidization process in short time.

Figure 5C:
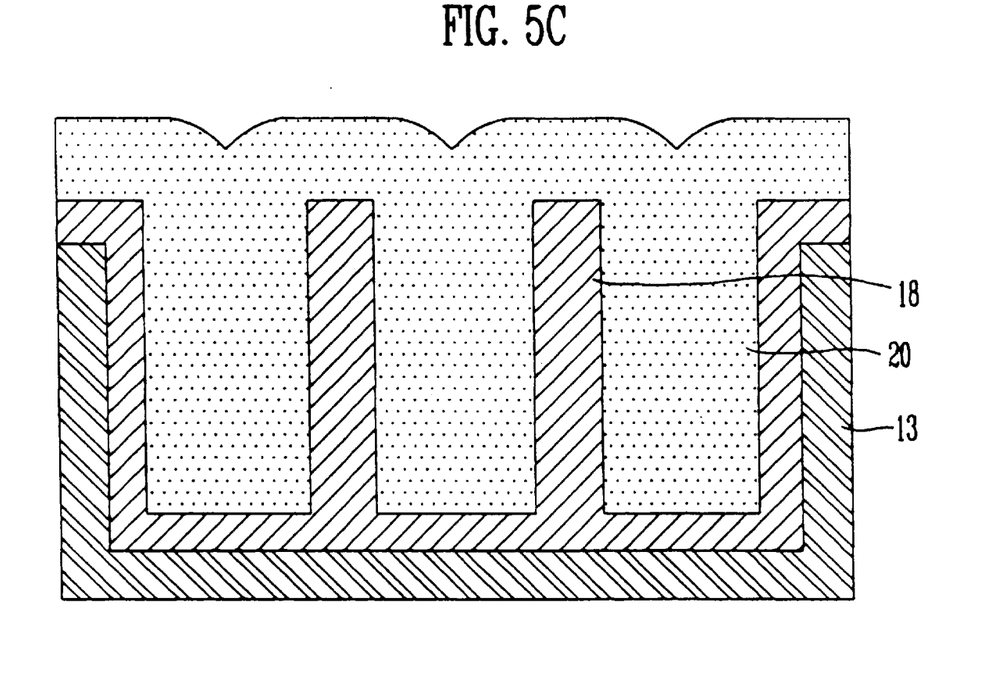
Figure 5D:
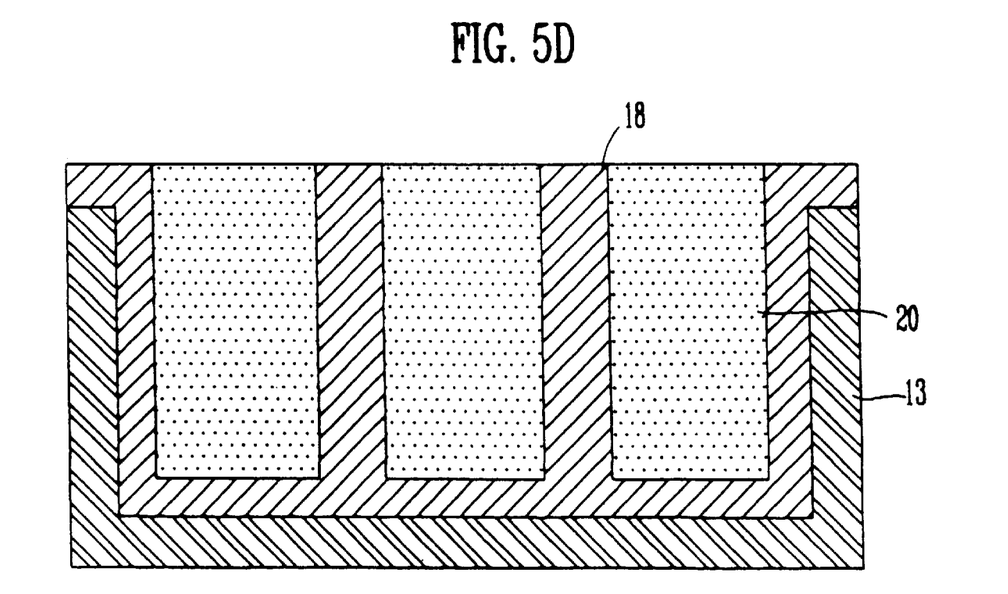

FIGS. 5c and 5d illustrate the processes of filling the trench with polycrystalline silicon, where they show the sectional views of the trench substrate after the process of depositing polycrystalline silicon 20 not doped with impurities so as to fill the depth of the trenches in the trench substrate with the polycrystalline silicon, and then cutting off the polycrystalline silicon 20 up to the surface of the second insulating layer 18 by a chemical and mechanical polish.

Figure 5E:
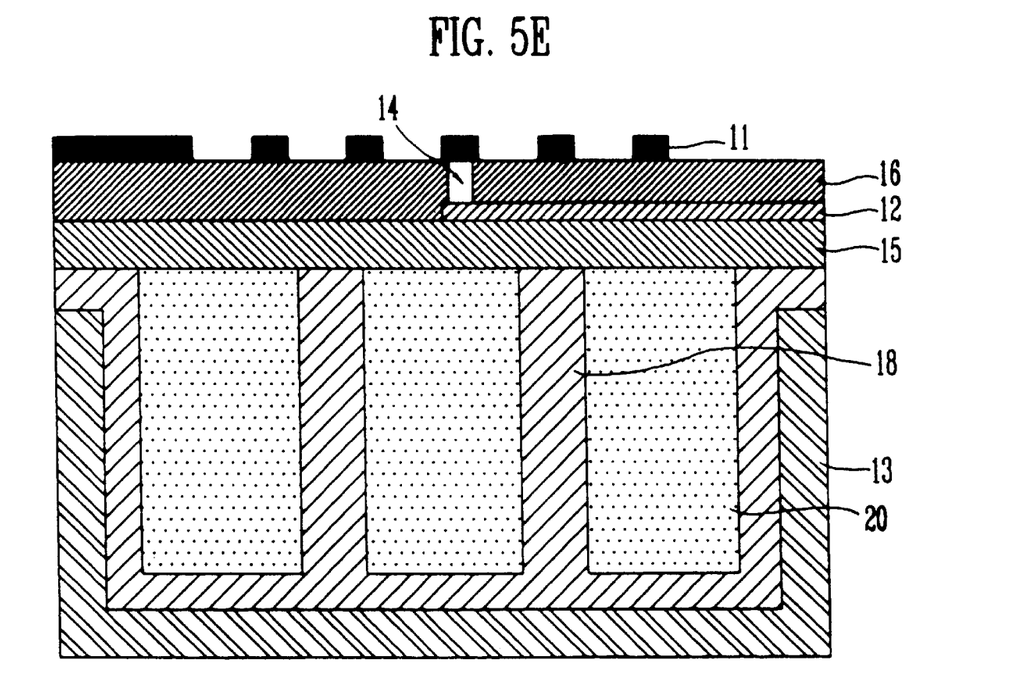

FIG. 5e illustrates the process of manufacturing the inductor metal lines. After depositing third insulating layer 15 of 0.2 to 1 micrometer over the area filled with polycrystalline silicon 20 inside the trench substrate, deposit metal of 0.5 to 1 micrometer thickness on which etching is performed to form first metal line 12. After depositing fourth insulating layer 16 by 0.5 to 2 micrometers over the first metal line 12, form via holes by etching using a mask. And then deposit metal 11 in thickness of 0.5 to 5 micrometers, over which etching is performed using a mask to form second metal line 11. At this time, the second metal line is formed in a spiral shape. The metal line may be formed in more than 3 layers.

Figure 6:
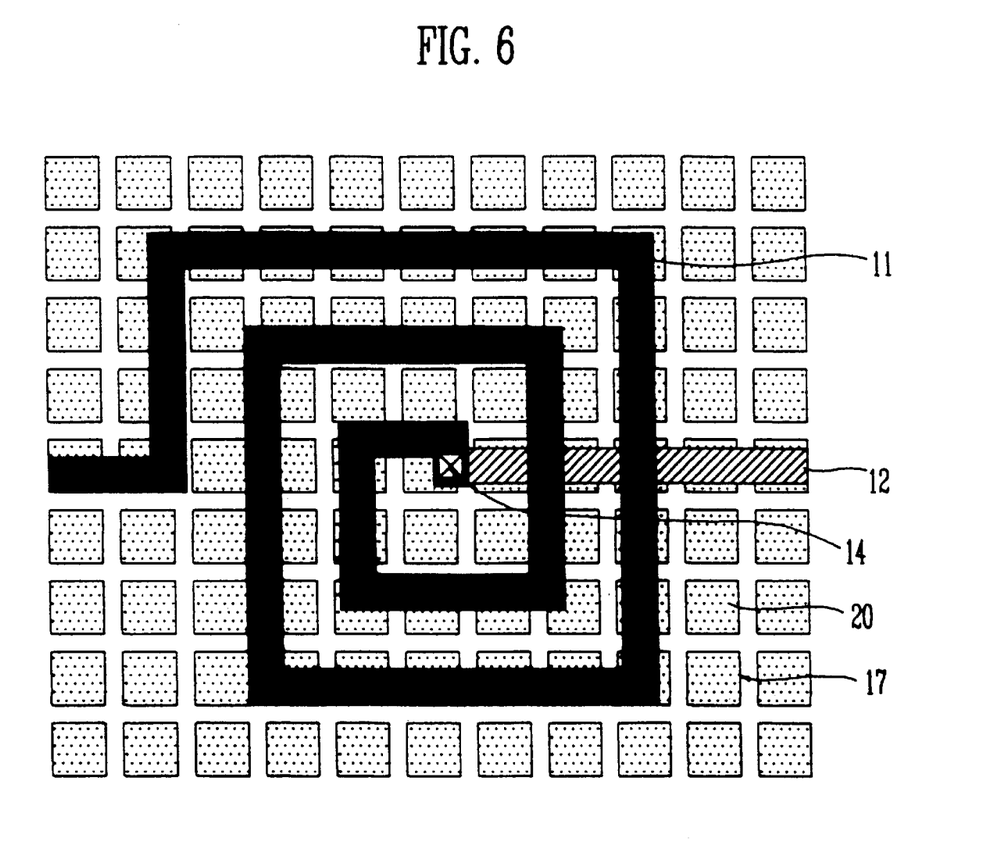
FIG. 6 is a top view illustrating the inductor of second embodiment according to the present invention.

FIG. 6 illustrates the inductor of second embodiment according to the present invention, in which trenches disposed under the metal line have a circular shape or a shape with length and width of the trenches being similar. The manufacturing method of this embodiment is the same as that described related to the first embodiment.

Figure 7:
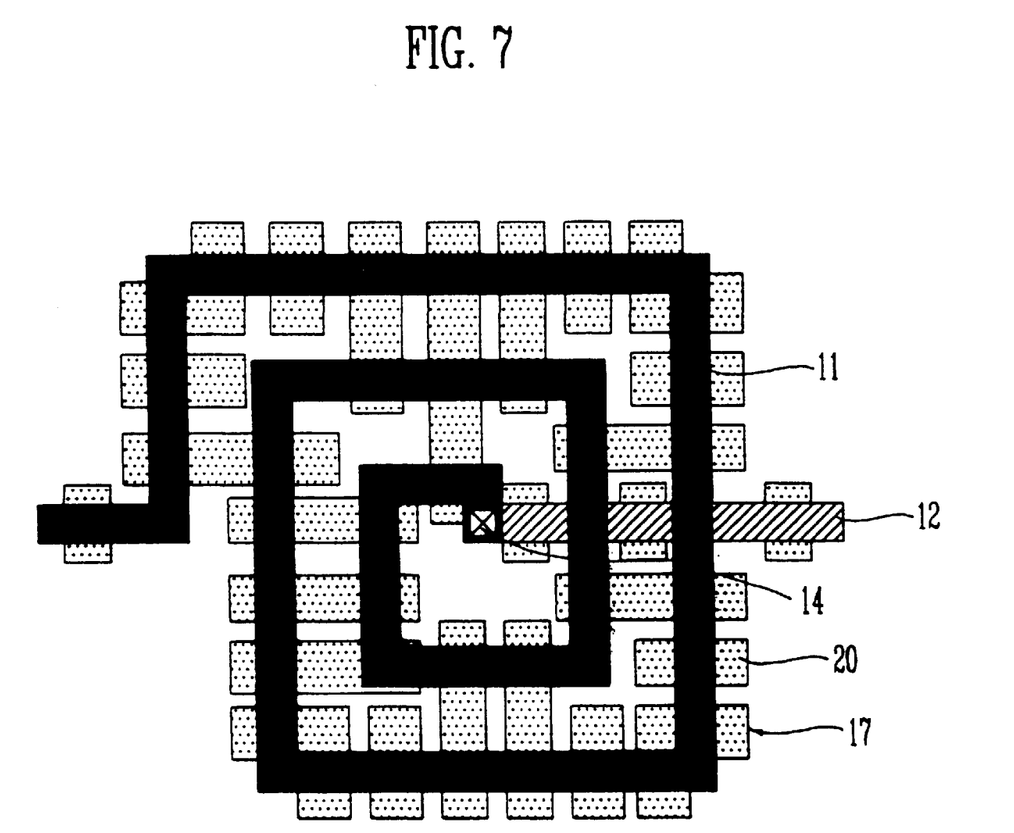
FIG. 7 is a top view illustrating the inductor of third embodiment according to the present invention.

FIG. 7 illustrates the inductor of third embodiment according to the present invention in top view, in which trenches disposed under the metal line have such a structure that the metal line of the inductor crosses with the trenches. The manufacturing method of this embodiment is the same as that described related to the first embodiment.

Figure 8:
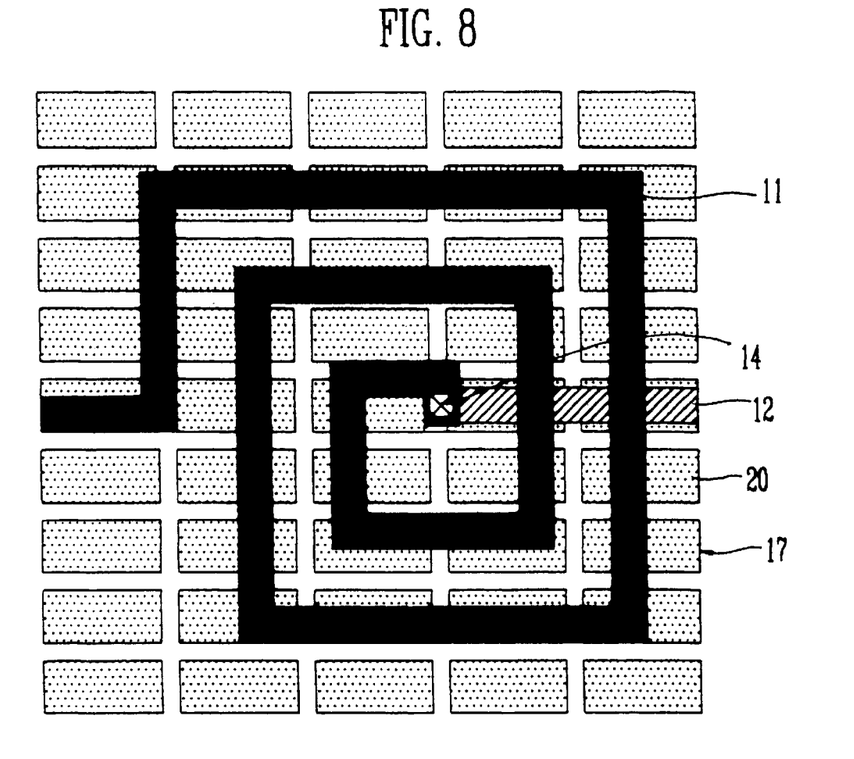
FIG. 8 is a top view illustrating the inductor of fourth embodiment according to the present invention.

FIG. 8 illustrates the inductor of fourth embodiment according to the present invention in top view, in which trenches disposed under the metal line have a rectangular shape. The manufacturing method of this embodiment is the same as that described related to the first embodiment.

Figure 9:
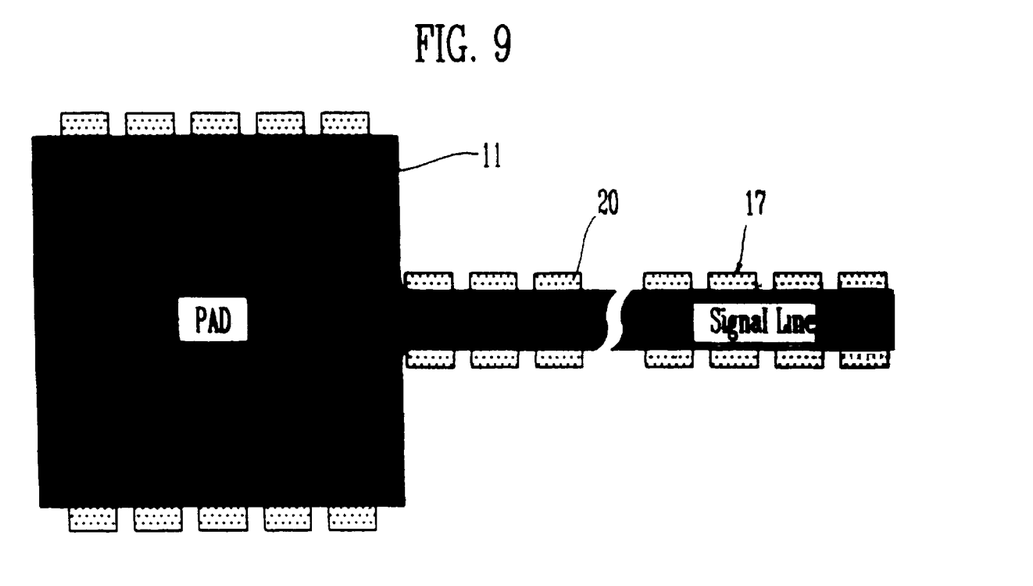
FIG. 9 is a top view illustrating pads and high-frequency signal lines utilizing the present invention.

FIG. 9 illustrates in top view the result of applying the trench process according to the present invention to the manufacture of bonding pads of high-frequency integrated circuits and high-frequency signal lines of internal circuits. It has a feature of enhancing the characteristics of the high-frequency operation and reducing the power consumption as it can reduce the parasitic capacitance between the bonding pads, high-frequency signal lines and the silicon substrate. The manufacturing method is the same as that described related to the first embodiment.

As described above, the present invention physically changes the parasitic capacitance and resistance between the silicon substrate and metal line of the inductor, whereby improving the quality factor of the inductor. Thus, it provides a device and a method which make it possible to design and manufacture silicon MMICs to be used in GHz order with high productivity in which inductor, capacitors and active devices are integrated in the same chip.

Also, the present invention reduces the parasitic capacitance between bonding pads, high-frequency signal lines and the silicon substrate, thereby helping to improve operating speed of the high-frequency digital and analog integrated circuits and to reduce power consumption.

As described above, according to the present invention, it is possible to increase the resistance of the substrate easily only in the local portions where inductor are integrated, thereby making it feasible to implement so-called integrated inductor. And it is possible to manufacture a silicon MMIC in which transistors as an active device and inductor as a passive device can be integrated in the same chip. As a result, because it is possible to manufacture integrated high-frequency circuits with active devices such as bipolar transistors and MOS transistors and passive devices such as inductor by differentiating resistance of the substrate, extraordinary improvement can be achieved in the characteristics of the silicon MMIC and cost.

What is claimed is:

1. A manufacturing method of an inductor on a silicon substrate, comprising steps of:

forming first insulating layer on the silicon substrate, and then forming trench substrate having two or more trenches by etching selected areas in said silicon substrate using a mask, and then removing the first insulating layer so that said trench substrate is exposed;

forming second insulating layer by applying oxidation process on said trench substrate;

depositing undoped polycrystalline silicon on the entire structure of said trench substrate, and then polishing said polycrystalline silicon to the surface of said second insulating layer by the chemical and mechanical polishing method;

depositing third insulating layer and a metal layer successively on the trench substrate where said polycrystalline silicon is filled, and then forming first metal line by an etching process using a mask; and depositing fourth insulating layer on said first metal line, forming via holes by an etching process using a mask on selected areas of said fourth insulating layer, depositing metal layer, and then forming second metal line by an etching process using a mask.

2. The manufacturing method according to claim 1, wherein said trenches are disposed in such a structure that the distance between the trenches is smaller than the length of the trenches.

3. The manufacturing method according to claim 1, wherein said trenches are disposed in such a structure that the depth of the trenches is larger than the width of the trenches.

4. The manufacturing method according to claim 1, wherein all silicon walls between said trenches are formed to insulating layer by an oxidation process.

5. The manufacturing method according to claim 1, wherein said trenches are disposed in such a structure that the length of the trenches is larger than the width of the trenches located under the metal line of the inductor, and that said length is larger than the planar length of the inductor composed of the first and second metal lines on the trenches.

6. The manufacturing method according to claim 1, wherein said trenches located under the metal line of the inductor have a circular shape or a shape with length and width of the trenches being similar.

7. The manufacturing method according to claim 1, wherein said trenches have such a structure that the metal line of the inductor crosses with the trenches located under the metal line of the inductor.

8. The manufacturing method according to claim 1, wherein said trenches have such a structure that the trenches located under the metal line of the inductor have a rectangular shape.

9. The manufacturing method according to claim 1, the trench substrate on which the trenches are formed is used for bonding pads and high-frequency signal connection lines in integrated curcuits.

10. The manufacturing method according to claim 1, wherein said second metal line has a spiral structure.

11. The manufacturing method according to claim 1, wherein said metal line is composed of more than 3 layers.

12. The manufacturing method according to claim 1, wherein said second and fourth insulating layer are oxidized up to 0.5 to 2 micromerters.

13. The manufacturing method according to claim 1, wherein said third insulating layer is oxidized up to 0.2 to 1 micrometer.

14. The manufacturing method according to claim 1, wherein said first metal line is deposited up 0.5 to 1 micrometer.

15. The manufacturing method according to claim 1, wherein said second metal line is deposited up to 0.5 to 5 micrometers.

* * * * *